United States Patent
Yoshida et al.

(10) Patent No.: US 6,301,144 B1
(45) Date of Patent: Oct. 9, 2001

(54) SEMICONDUCTOR MEMORY DEVICE

(75) Inventors: Munehiro Yoshida; Yohji Watanabe, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/650,745

(22) Filed: Aug. 30, 2000

(30) Foreign Application Priority Data

Aug. 31, 1999 (JP) .................................................. 11-246173

(51) Int. Cl.[7] ........................................................ G11C 7/00
(52) U.S. Cl. ........................................ 365/63; 365/189.01
(58) Field of Search ................................ 361/63, 189.01, 361/202, 230.01, 230.06

(56) References Cited

U.S. PATENT DOCUMENTS

| 4,061,908 | * 12/1977 | de Jonge et al. ................ 365/201 |
| 4,692,901 | 9/1987 | Kumanoya et al. . |

FOREIGN PATENT DOCUMENTS 7-262797   10/1995   (JP) .

* cited by examiner

*Primary Examiner*—Terrell W. Fears
(74) *Attorney, Agent, or Firm*—Finnegan, Henderson, Farabow, Garrett, & Dunner, L.L.P.

(57) ABSTRACT

A memory chip is comprises memory cells and, for example, 16 amplifiers, each having a first output terminal and a second output terminal. The 16 amplifiers are connected at the first output terminal to 16 first-type signal lines RD(0) to RD(15) and at the second output terminal to four second-type signal lines bTRD(0) to bTRD(3) in increment fashion. More precisely, the second output terminals of every four amplifiers are connected the four second-type signal lines, respectively. A coincidence/non-coincidence determining circuit determines how the potentials of the second-type signal lines bTRD(0) to bTRD(3) and the potentials of the first-type signal lines RD(0) to RD(15) connected to all amplifiers that are connected to the second-type signal lines change when all data items of the same polarity are read from memory cells. Hence, a compressed-data test can be performed thereby compressing 16-bit data into 4-bit data by using only 20 signal lines.

18 Claims, 5 Drawing Sheets

IN NORMAL OPERATING MODE

FIG. 3A (PRIOR ART)

IN COMPRESSED-DATA TEST MODE

IN NORMAL OPERATING MODE

FIG. 7A

IN COMPRESSED-DATA TEST MODE

FIG. 7B

SEMICONDUCTOR MEMORY DEVICE

CROSS-REFERENCE TO RELATED APPLICATIONS

This application is based upon and claims the benefit of priority from the prior Japanese Patent Application No. 11-246173, filed Aug. 31, 1999, the entire contents of which are incorporated herein by reference.

BACKGROUND OF THE INVENTION

The present invention relates to a semiconductor memory device. More particularly, the invention relates to a compressed-data test to be performed on DRAM (Dynamic Random Access Memory).

In recent years, the storage capacity of DRAMs has increased to meet the demand in the market, thanks to the advancement in the manufacturing technology. The greater the storage capacity of a memory chip, the longer the time required to test the memory chip. This is because, data must be written into and read from all memory cells (bits) in the test. If the storage capacity increases four times, four times as much time is required to test the memory chip.

To shorten the test time, the compressed-data test is effected and useful as is known in the art. In the compressed-data test, a number of bits are accessed at a time, and the data consisting of these bits is compressed into data consisting of a smaller number of bits, such as eight bits or four bits. It is then determined whether each bit indicates that the corresponding bits stored in the memory cells one cell are identical in polarity or that that the corresponding bits are not identical in polarity. The more bits (e.g., 64 bits or 128 bits) are accessed simultaneously, the shorter the test time.

Assume that 64 bits are accessed at a time in a memory chip designed such that data is read from it in units of four bits, and that these bits are compressed into a data item consisting of four bits. Then, the test time is reduced to $\frac{1}{16}$. Namely, 64 bits are accessed in the memory chip, though it seems as if 4-bit data were accessed.

If all bits constituting the data to be compressed are of the same polarity, "1" will be read from the memory chip. Otherwise, "0" will be read from the memory chip. To utilize this data-compressing method, bits of the same polarity must be written into the memory cells which will be accessed at the same time.

The conventional data-compressing method will be described in greater detail, with reference to FIG. 1 that is a schematic representation of a memory chip.

Figure 1:
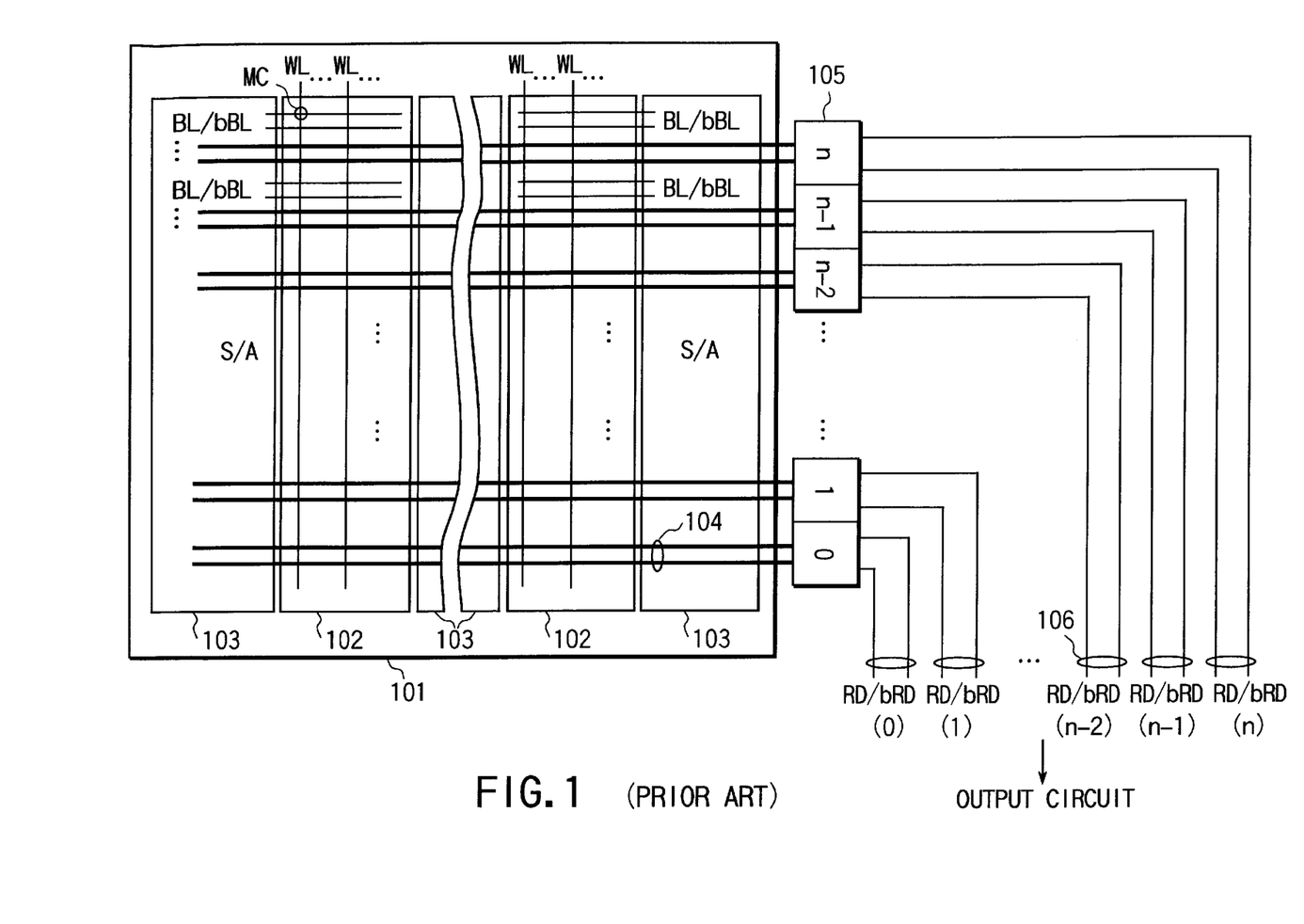
FIG. 1 is a schematic representation of a memory chip, for explaining the prior art and the disadvantageous aspect of the prior art.

As shown in FIG. 1, each bank 101 of the memory cell array comprises a plurality of cell sections 102 and a plurality of sense amplifiers (S/A) 103. Any two adjacent sense amplifiers 103 are arranged on two sides a cell section 102, respectively. Word lines WL extend parallel over the cell section 102, and bit lines BL/bBL extend at right angles to the word lines WL, over the bank 101, too. Memory cells MC are arranged at the intersections of the word lines WL and the bit lines BL/bBL; they are arranged in rows and columns, forming a matrix. Data-line pairs 104 are connected to the sense amplifiers 103. Each data-line pairs 104 can be selected in accordance with a column address. Amplifiers 105 are provided outside the bank 101 and connected to the data-line pairs 104, respectively. Each amplifier 105 has two output terminals, to which two signal lines RD and bRD are connected at one end. The signal lines RD and bRD make a signal-line pair 106. The signal lines RD and bRD are connected at the other end to an output circuit (not shown) that is designed to output data from the memory chip.

While the memory chip remains in the normal operating mode, the sense amplifiers 103 can be activated. When activated, the sense amplifiers 103 read data from the memory cells MC. The data, thus read, is supplied the data-line pairs 104 that have been supplied through column-selecting lines selector (not shown). The signal representing the data and supplied via each data-line pair 104 is amplified by the amplifier 105 connected to the data-line pair 104. The signal amplified is supplied to the output circuit through the signal-line pair 106.

The least number of amplifiers 105 and the least number of signal-line pairs 106, which should be activated, depend upon how many bits are simultaneously read from the memory cells MC provided in the bank 101. If it is necessary to read at most four bits at a single access, four amplifiers 105 and four signal-line pairs 106 must be activated. Alternatively, five or more amplifiers 105 and five or more signal-line pairs 106 are activated, and four bits are read simultaneously or not simultaneously from the memory chip (this method of reading bits is known as "pre-fetch method"). In either case, the signal-line pairs 106 must be activated in at least the same number as the bits that should be read at a single access.

While the memory chip of FIG. 1 remains in, for example, the compressed-data test, 64-bit data may be compressed into 4-bit data, thus accomplishing so-called $\frac{1}{16}$ data compression. More specifically, 64 amplifiers 105 and 64 signal-line pairs 106 are activated, thereby reading 64 bits from 64 memory cells MC, into which bits of the same polarity have been written. The 64 bits read are supplied to a coincidence/non-coincidence determining circuit (not shown), which compresses the 64-bit data into 4-bit data, wherein each bit indicates whether 16 bits are of the same polarity or not. That is, the circuit outputs a bit "1" if all 16 bits are of the same polarity, and a bit "0" if all 16 bits are not of the same polarity.

In this case, the memory chip need to have 64 signal-line pairs 106, that is, as many signal-line pairs 106 as the number (64) of bits to be accessed, irrespective of the number (4) of bits into which the determining circuit compresses input data. While the memory chip remains in the normal operating mode, it suffice to use four signal-line pairs 106 (i.e., eight signal lines). As long as the chip remains in the compressed-data test mode, however, 64 signal-line pairs 106 (i.e., 128 signal lines) must be used. In the case where 128-bit data is compressed, 128 signal-line pairs 106 (i.e., 256 signal lines) must be used. The memory chip therefore needs to have a large wiring region to accommodate so many signal-line pairs.

To prevent an increase in the size of the wiring region, it is proposed that the signal lines be pre-charged so as to perform part of the function of the coincidence/non-coincidence determining circuit.

Figure 2:
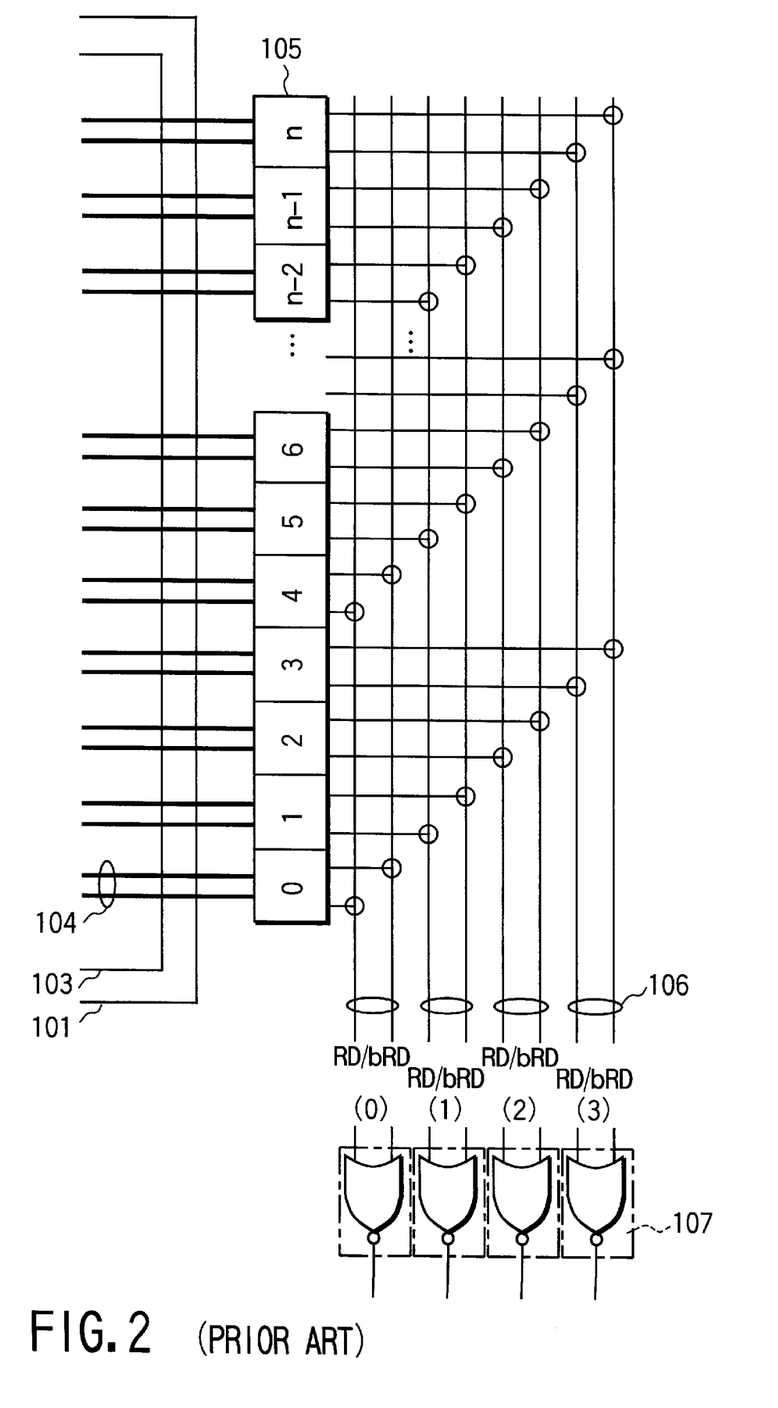
FIG. 2 is a diagram showing a part of a conventional memory chip in which the signal lines are pre-charged.

FIG. 2 shows a part of a conventional memory chip in which the signal lines are pre-charged to perform part of the function of the coincidence/non-coincidence determining circuit. This memory chip is so designed that at most four bits are accessed at a time and four signal-line pairs 106 (i.e., eight signal lines) are provided.

The memory chip of FIG. 2 comprises NOR circuits 107, each designed to determine whether the two input bits are identical or not, and an output circuit (not shown) for outputting data from the memory chip. The memory chip has as many signal-line pairs 106 as the bits to be read from the bank 101 at a single access. Each signal-line pair 106 is connected at one end to the output terminals of the amplifiers 105, for supplying the bits, in so-called "increment" fashion. Each signal-line pair 106 is connected at the other end to one NOR circuit 107 and also to the output circuit (not shown).

Figure 3A:
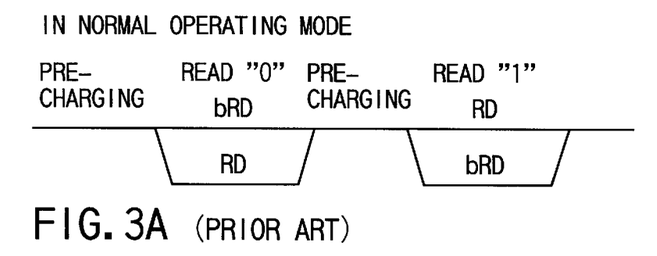
FIG. 3A is a chart illustrating how the memory chip of FIG. 2 operates in the normal operating mode.

While the memory chip remains in the normal operating mode, both signal lines RD and bRD of each pair 106 are pre-charged to high level "Hi" as shown in FIG. 3A. If data "0" is read via any data-line pair 104 connected to the amplifier 105 which is connected to the signal-line pair 106, one of the signal lines 106 (in this case, line RD) is driven at low level "Lo". If data "1" is read via that data-line pair 104, the other of the signal lines 106 (i.e., line bRD) is driven at low level "Lo". In other words, each amplifier 105 discharges one signal line RD or other signal line bRD of the pair 106, in accordance with the polarity of the data read via the data-line pair 104. Hence, the output circuit outputs 4-bit data, that is, from the memory chip, as either the signal line RD or the signal line bRD is discharged while the memory chip remains in the normal operating mode.

Figure 3B:
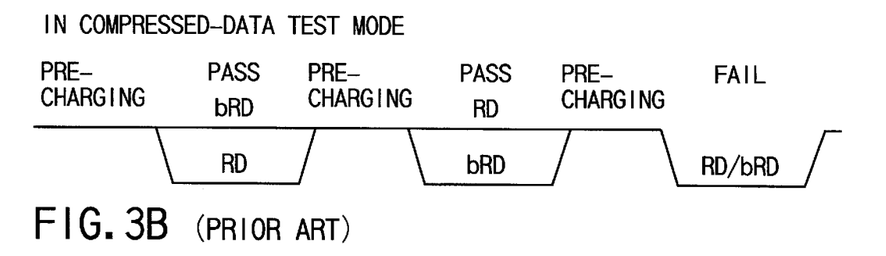
FIG. 3B is a chart illustrating how the memory chip of FIG. 2 operates in the compressed-data test mode.

Thus, the data read from the memory cells can be compressed, merely by outputting the data items from the all amplifiers 105 activated to the same signal-line pair 106 at the same time. In the compressed-data test mode, both signal lines RD and bRD of each pair 106 are pre-charged to high level "Hi" as shown in FIG. 3B. The signal line RD or bRD of each pair 106 must remain at high level "Hi" if all data bits supplied from the amplifier 105 to the signal-line pair 106 are of the same polarity. If both signal lines RD and bRD remain at low level "Lo", it means that the data read consists of "1" bits and "0" bits. Hence, each NOR circuit 107 can compress 16-bit data to 1-bit data if 16 bits are read to the same signal-line pair 106, that is, if 16 bits are read from 16 amplifiers 105 at the same time. The output of the NOR circuit 107 is "1" only if the signal lines RD and bRD are at low level "Lo". Thus, the compressed-data rest can be carried out with ease, since each NOR circuit 107 generates the inverted logic product of the two bits on the signal lines RD and bRD. (That is, it can be easily determined whether each bit indicates that the corresponding bits stored in the memory cells one cell are identical in polarity or that that the corresponding bits are not identical in polarity.) Needless to say, it is necessary set write bits in the cells so that each amplifier 105 may supply two bits of the same polarity to the lines RD and bRD of the signal-line pair 106.

In the memory chip of FIG. 2, the number of signal-line pairs 106 required is equal to the number of bits that should be read from the bank 101 at the same time. Namely, at least four signal-line pairs (eight signal lines) 106 are necessary to read four bits at the same time, and at least 16 signal-line pairs (32 signal lines) 106 are necessary to read 16 bits at the same time. The number of bits constituting data that can be compressed is equal to the number of amplifiers 105 activated. This means that at most as many bits as the amplifiers 105 provided can be tested at the same time.

Were the memory chip shown in FIG. 2 designed to operate in the normal operating mode only, the number of signal lines required could be decreased further, by using single lines instead of signal-line pairs 106.

In this case, each amplifier has one output terminal, which is connected to one signal line. Hence, it suffices to use at least as many signal lines as the largest number of bits that can be read at a single access. Namely, it suffices to provide at least four signal lines in order to read at most four bits at a time. If the memory chip were so designed, however, the data read from the bank 101 could not be compressed. In order to compress the data, signal lines as many as the bits constituting the largest data that can be compressed.

BRIEF SUMMARY OF THE INVENTION

The object of the present invention is to provide a semiconductor memory device which needs to have but a small number of signal lines and which therefore has a small chip surface and can be tested within a short time.

To achieve the object, a semiconductor memory device according to the invention comprises: a cell array comprising a plurality of memory cells; a plurality of sense amplifiers for detecting data items stored in the memory cells; a plurality of amplifiers connected to the sense amplifiers, each having first and second output terminals from which two outputs complementary to each other are output; a plurality of first-group signal lines connected at one end to the first output terminals of the amplifiers; at least one second-group signal line connected at one end to the second output terminal of at least one of the amplifiers; at least one coincidence/non-coincidence determining circuit connected to the first-group signal lines and the at least one second-group signal line, for determining whether data items simultaneously read from the cell array are identical.

Another semiconductor memory device according to this invention comprises: a cell array comprising a plurality of word lines, a plurality of bit lines intersecting with the word lines, and memory cells arranged at intersections of the word lines and bit lines, forming a matrix; a plurality of sense amplifiers for detecting data items stored in the memory cells; a plurality of amplifiers connected to the sense amplifiers, each having first and second output terminals from which two outputs complementary to each other are output; a plurality of first-type signal lines provided in a maximum number of data items that can be read from the cell array simultaneously, the amplifiers having the first output terminals connected to the first-type signal lines in increment fashion, such that the first output terminals of the amplifiers of any group consisting of as many amplifiers as the maximum number of data items are connected to the first-type signal lines, respectively; at least one second-type signal line provided in a number of data items constituting compressed data, the amplifiers having the second output terminals connected to the second-type signal lines in increment fashion, such that the second output terminals of the amplifiers of any group consisting of as many amplifiers as the data items constituting the compressed data are connected to the second-type signal lines, respectively; and at least one coincidence/non-coincidence determining circuit connected to the first-group signal lines and the at least one second-group signal line, for determining whether each bit of the compressed data indicates that the corresponding bits stored in the memory cells one cell are identical in polarity.

A compressed-data test can be efficiently performed on the semiconductor memory device according to the invention, by using a relatively small number of signal lines even if many data items are read from the memory chip at the same time. The number of signal lines required is thereby prevented from increasing so much as the number of data items that must be read simultaneously increases.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described, with reference to the accompanying drawings.

Figure 4:
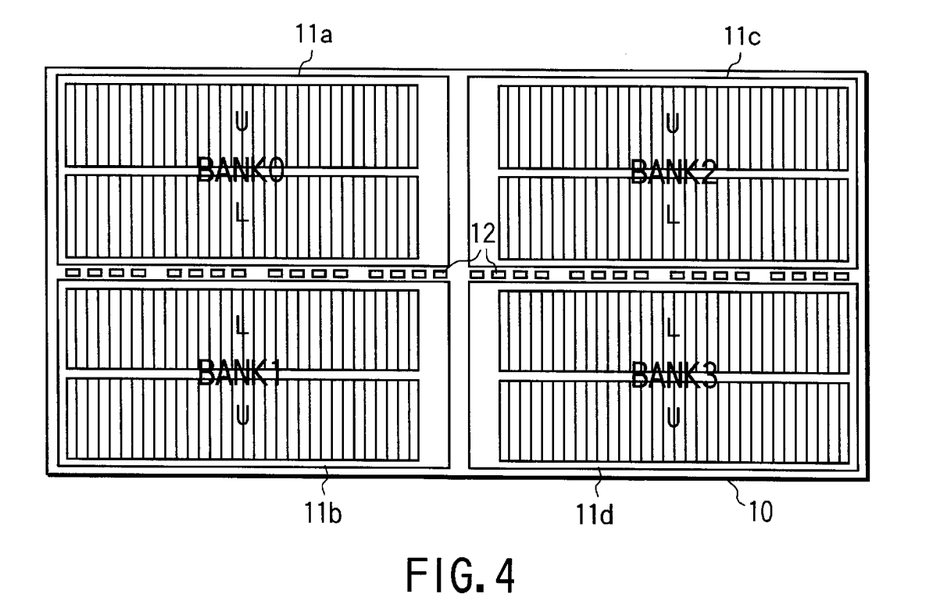
FIG. 4 is a plan view schematically depicting the structure of a memory chip according to the present invention.

FIG. 4 is a schematic representation of a memory chip according to the present invention. The memory chip 10 has a memory cell array that is composed of four banks 11a to 11d. The memory chip 10 comprises a row decoder, a column decoder, a sense amplifier, a pre-decoder, an address input circuit, a data input/output circuit, a pulse synthesizing circuit and a control pin input circuit (not shown). Pads 12 are provided between the banks 11a and 11b and also between the banks 11c and 11d. Of these pads 12, some are used to input addresses, some others are used to input and output data, and the remaining ones are used supply power.

Figure 5:
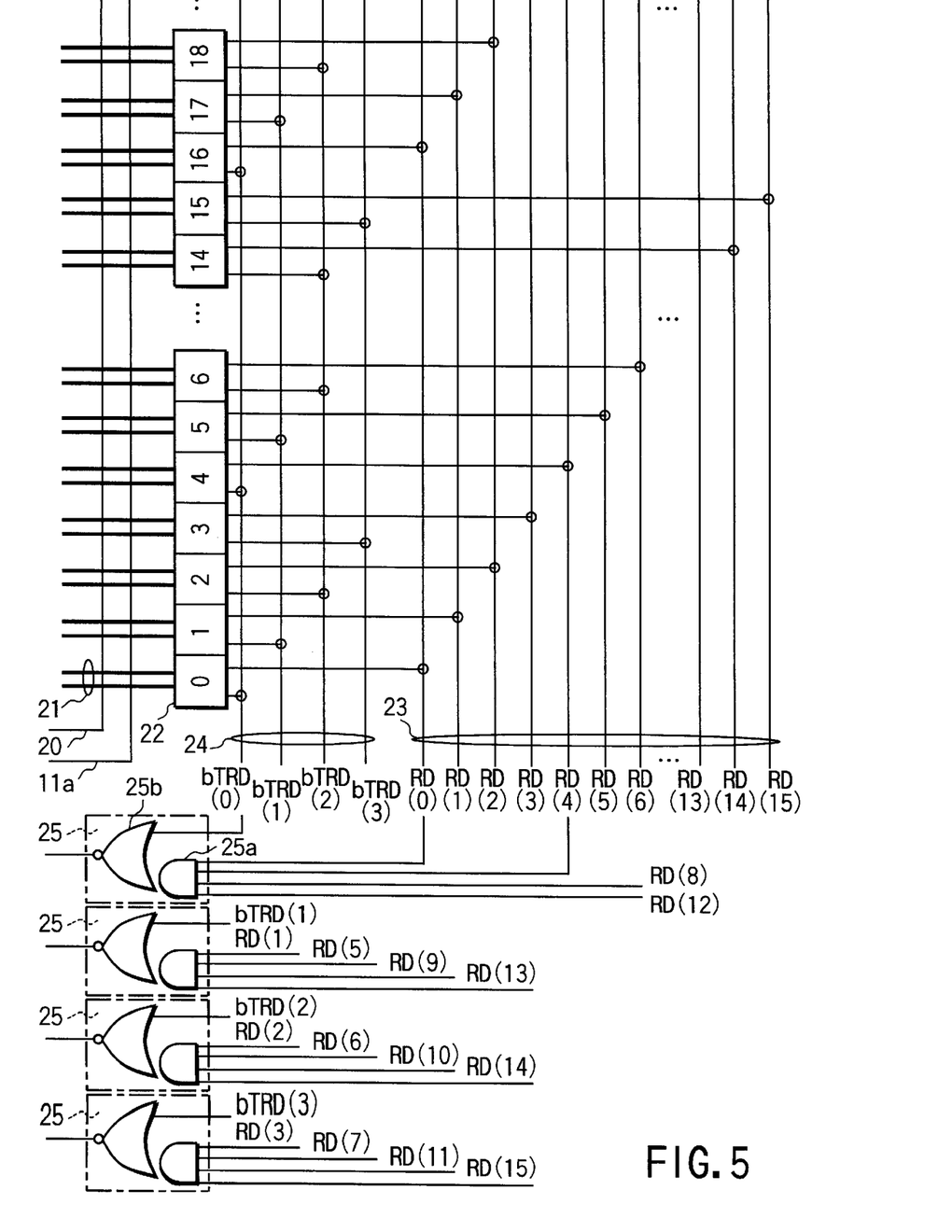
FIG. 5 is a circuit diagram showing a major section of the memory chip illustrated in FIG. 4.

FIG. 5 is a magnified view of a major section of the memory chip 10. The memory chip 10 can operate in the normal operating mode and the compressed-data test mode. In the normal operating mode, at most 16 bits are read from one bank (e.g., bank 11a) at a time. In the compressed-data test mode, 16-bit data is compressed to 4-bit data (thereby accomplishing ¼ compression).

As shown in FIG. 5, data-line pairs 21 extend from the bank 11a and are connected to amplifiers 22 (at least 16 amplifiers), respectively. The amplifiers 22 have two output terminals each, from which two outputs complementary to each other are output. Hereinafter, the two output terminals of each amplifier 22 will be referred to as "first output terminal" and "second output terminal", respectively. The first output terminals of every 16 amplifiers 22, which are connected to 16 bit-line pairs 21 accessed at a time, are connected to 16 signal lines RD(0) to RD(15) of a first group 23 in so-called "increment" fashion. More specifically, the first output terminals of the 0th amplifier, 16th amplifier, 32nd amplifier, and so on, are connected to the signal line RD(0); the first output terminals of the first amplifier, 17th amplifier, 33rd amplifier, and so on, are connected to the signal line RD(1); and the first output terminals of the second amplifier, 18th amplifier, 34th amplifier, and so on, are connected to the signal line RD(2). The first output terminals of the other amplifiers 22 are connected to the other signal lines RD(3) to RD(15), in similar manner. For example, the first output terminals of the 15th amplifier, 31st amplifier, 47th amplifier, and so on, are connected to the signal line RD(15).

The second output terminals of every four amplifiers 22 are connected to four signal lines bTRD(0) to bTRD(3) of a second group 24 in increment fashion, too. More specifically, the second output terminals of the 0th amplifier, fourth amplifier, eighth amplifier, 12th amplifier, and so on, are connected to the signal line bTRD(0); and the second output terminals of the first amplifier, fifth amplifier, ninth amplifier, 13th amplifier, and so on, are connected to the signal line bTRD(1). The second output terminals of the other amplifiers 22 are connected to the other signal lines bTRD(2) and bTRD(3), in similar manner. For example, the second output terminals of the third amplifier, seventh amplifier, 11th amplifier, 15th amplifier, and so on, are connected to the signal line bTRD(3).

The bank 11a, in which the sense amplifier 20 and the like are provided, is basically the same as the bank 101 illustrated in FIG. 1. Therefore, the bank 11a is not described here.

The signal lines 23 and 24 are connected to coincidence/non-coincidence determining circuits 25. Of the signal lines 23 and 24, at least signal lines 23 are connected to the data input/output circuit (not shown) provided to output data from the bank 11a.

The coincidence/non-coincidence determining circuits 25 comprises an AND circuit 25a and a NOR circuit 25b each. The AND circuit 25a has four input terminals. The four input terminals of the AND circuit 25a are connected to four of the signal lines 23, which connected to four amplifiers 22 which have their second output terminals connected to the same signal line 24. As shown in FIG. 5, the AND circuit 25a of, for example, the first coincidence/non-coincidence determining circuits 25 has its four inputs connected to the signal lines (RD(0), RD(4), RD(8) and RD(12)) 23, which are connected to the first output terminals of the 0th amplifier, fourth amplifier, eighth amplifier and 12th amplifier, respectively. The NOR circuit 25b has two input terminals, one of which is connected to the output terminal of the AND circuit 25a. The other input terminal, or second input terminal, of the NOR circuit 25b is connected one of the four signal lines 24. As shown in FIG. 5, the NOR circuit 25b of, for example, the first coincidence/non-coincidence determining circuits 25 has its second input terminal connected to the signal line (bTRD(0)) 24.

Figure 6:
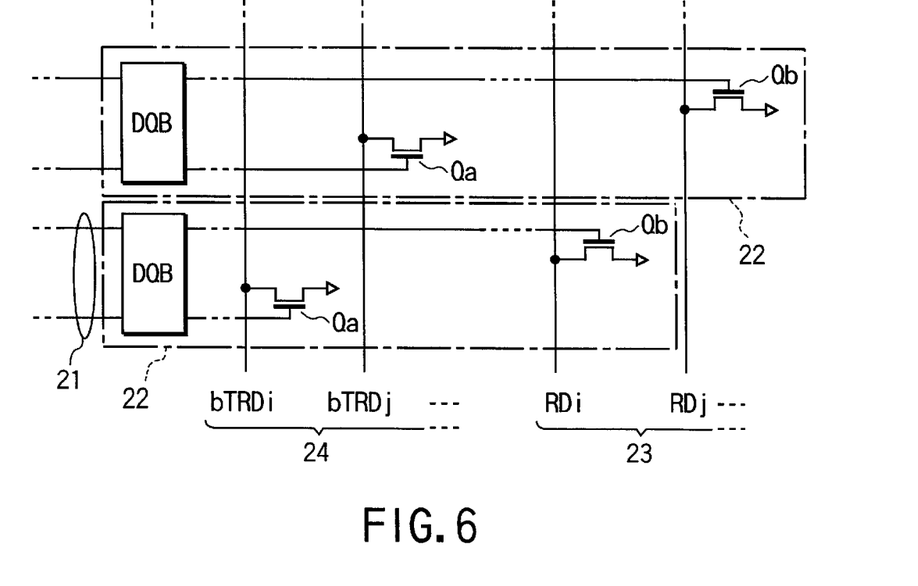
FIG. 6 is a circuit diagram of one of the identical amplifier provided in the memory chip of FIG. 5.

The amplifiers 22 have the structure shown in FIG. 6. As shown in FIG. 6, each amplifier 22 comprises two N-channel MOS transistors Qa and Qb and a control circuit DQB. The control circuit DQB controls the MOS transistors Qa and Qb, thereby discharging (or charging) either a signal line 23 or a signal line 24.

How the compressed-data test is performed on the memory chip 10 will be described.

Figure 7A:
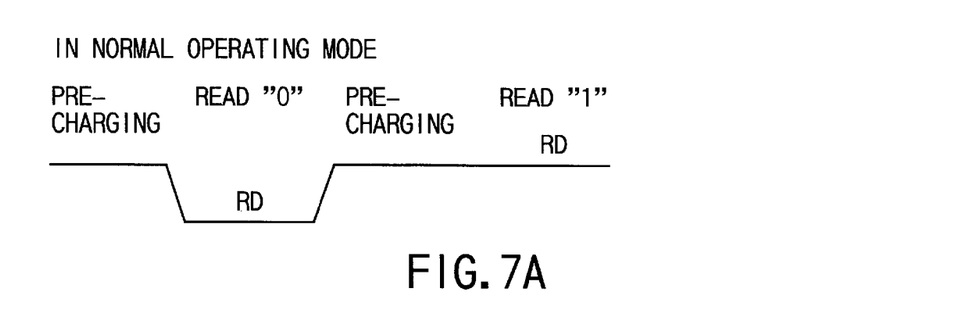
FIG. 7A is a chart illustrating how the memory chip of FIG. 5 operates in the normal operating mode.
Figure 7B:
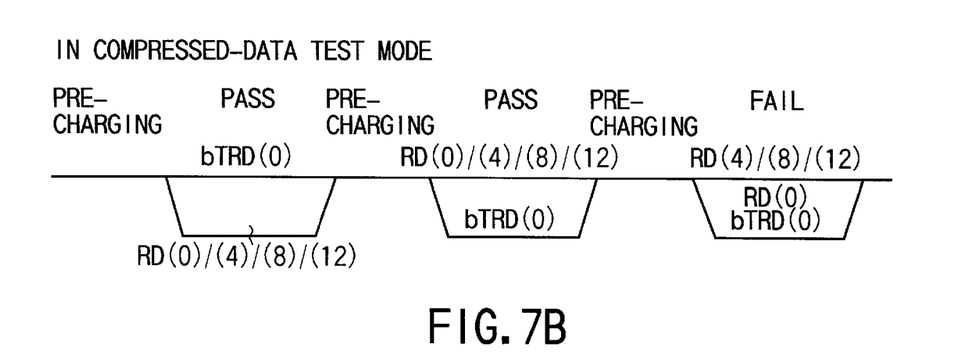
FIG. 7B is a chart illustrating how the memory chip of FIG. 5 operates in the compressed-data test mode.

FIG. 7A illustrates how the memory chip 10 operates in the normal operating mode, and FIG. 7B how the memory chip 10 operates in the compressed-data test mode. More precisely, FIG. 7A shows the relation which the potentials of the signal lines (RD(0), RD(4), RD(8) and RD(12)) 23 changes have with the potential of the signal line (bTRD(0)) 24 change in the normal operating mode. FIG. 7B shows the relation which the potentials of the signal lines (RD(0), RD(4), RD(8) and RD(12)) 23 changes have with the potential of the signal line (bTRD(0)) 24 change in the compressed-data test mode.

While the chip 10 operating in the normal operating mode, the signal lines 24 (i.e., lines bTRD(0) to bTRD(3)) are not used at all. Data is read via the signal lines 23 (i.e., lines RD(0) to RD(15)), by setting each line 23 at high level "Hi" or low level "Lo". Sixteen amplifiers 22 are selectively activated at the same time, reading 16-bit data through 16 signal lines 23.

While the chip 10 is operating in the compressed-data test mode, the signal lines 23 and signal lines 24 are pre-charged to the same level (e.g., high level "Hi"), as in the conventional memory chip shown in FIG. 2. Each coincidence/non-coincidence determining circuits 25 performs a logic operation on the signal on one signal line 24 and the signals on the four signal lines 23 connected to the first output terminals of the amplifiers 22 whose second output terminals are connected to that one signal line 24. The data read via the signal lines 23 is thereby compressed.

To be more specific, the firsts output terminals of at least four amplifiers 22 whose second output terminals are connected to one signal line 24, e.g., line bTRD(0), are connected to four signal lines (RD(0), RD(4), RD(8) and RD(12)) 23, respectively. If the four bits input to the four amplifiers 22 have the same polarity, the signal line (bTRD(0)) 24 will be set at low level "Lo" (thus, achieving multiplex output) or all four signal lines (RD(0), RD(4), RD(8) and RD(12)) 23 will be set at low level "Lo", as is illustrated in FIG. 7B. If the four bits input to the four amplifiers 22 do not have the same polarity, the signal line (bTRD(0)) 24 will be set at low level "Lo" and at least one (e.g., line RD(0)) of the four signal lines (RD(0), RD(4), RD(8) and RD(12)) 23 will be set at low level "Lo". Thus, it is detected that the four bits are not identical in polarity, when the signal lines (bTRD(0)) 24 and (RD(0)) 23 are at low level "LO".

The relation between the signal line (bTRD(1)) 24 and the signal lines (RD(1), RD(5), RD(9) and RD(13)) 23, the relation between the signal line (bTRD(2)) 24 and signal lines (RD(2), RD(6), RD(10) and RD(14)) 23, and the relation between the signal line (bTRD(3)) 24 and signal lines (RD(3), RD(7), RD(11) and RD(15)) 23 are the same as the above-described relation between the signal line (bTRD(0)) 24 and signal lines (RD(0), RD(4), RD(8) and RD(12)) 23.

In practice, bits to be read from the bank 11a at the same time are written in the same polarity. Of 16 bits simultaneously read from the bank 11a, every four are supplied to one coincidence/non-coincidence determining circuit 25. If the output of the circuit 25 is "Lo", it is determined that each bit passes the compressed-data test. If the output of the circuit 25 is "Hi", each bit fails the compression-data test. The 16-bit data is thereby compressed to 4-bit data. Thus, at most 16 bits can be read from the bank 11a at the same time in the normal operating mode, though only 20 signal lines (i.e., 16 lines 23 and four lines 24) are provided for the bank 11a. Furthermore, 16-bit data can be compressed to 4-bit data, accomplishing ¼ compression, in the compressed-data test mode.

As described above, the compressed-data test can be efficiently performed on the memory chip 10, by using a relatively small number signal lines, even if many bits should be read at the same time. More specifically, signal lines, which are provided in the same number as the sum of the bits to be read simultaneously and the bits forming the compressed data, are connected in a specific fashion to the output terminals of the amplifiers that are connected at input to the pairs. Data can be read from the memory chip 10 and compressed in both the normal operating mode and the compressed-data test mode. This prevents the number of necessary signal lines from increasing as the number of bits that should be read simultaneously increases. In other words, signal lines are required but in small numbers, thereby preventing an increase in the size of the wiring region in the memory chip and, ultimately, decreasing the size of the memory chip. Moreover, since signal lines are used in small numbers, the memory chip can be tested within a short time.

In the memory chip 10 described above, 16-bit data is compressed to 4-bit data. Nonetheless, the data compression that can be effected in the chip 10 is not limited to the ¼ data compression. Rather, other data compression can be performed in the memory chip 10, merely by changing the number of the signal lines 23 through which bits are read at the same time and the number of the signal lines 24 which equals the number of bits forming the compressed data.

Further, data consisting of data of more bits can be compressed if more amplifiers than can be activated are provided. For example, 64-bit data may be subjected to ¹⁄₁₆ data compression, thereby generating 4-bit data. Alternatively, 128-data may be subjected to ¹⁄₃₂ data compression, thereby generating 4-bit data. Needless to say, ⅛ data compression, ¹⁄₆₄ data compression, ¹⁄₁₂₈ data compression, and so on can be easily performed in a similar manner.

Moreover, the compressed-data test can be carried out on the entire memory cell array, instead of in units of banks 11a to 11d as described above.

Other various changes and modifications can be made, without departing from the scope and spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a cell array comprising a plurality of memory cells;
   a plurality of sense amplifiers for detecting data items stored in the memory cells;
   a plurality of amplifiers connected to the sense amplifiers, each having first and second output terminals from which two outputs complementary to each other are output;
   a plurality of first-group signal lines connected at one end to the first output terminals of the amplifiers;
   at least one second-group signal line connected at one end to the second output terminal of at least one of the amplifiers;
   at least one coincidence/non-coincidence determining circuit connected to the first-group signal lines and the at least one second-group signal line, for determining whether data items simultaneously read from the cell array are identical.

2. A semiconductor memory device according to claim 1, wherein the memory cells are arranged at intersections of a plurality of bit lines and a plurality of word lines.

3. A semiconductor memory device according to claim 2, wherein the memory cells are arranged in rows and columns, forming a matrix.

4. A semiconductor memory device according to claim 1, wherein the first-type signal lines are provided in greater numbers than the at least one second-type signal line.

5. A semiconductor memory device according to claim 4, wherein the first-type signal lines are provided in a maximum number of data items that can be read from the cell array simultaneously.

6. A semiconductor memory device according to claim 5, wherein the amplifiers are connected at first output terminal to the first-type signal lines in increment fashion, such that the first output terminals of the amplifiers of any group consisting of as many amplifiers as the maximum number of data items are connected to the first-type signal lines, respectively.

7. A semiconductor memory device according to claim 4, wherein the at least one second-type signal line is provided in number equal to the number of data items constituting compressed data.

8. A semiconductor memory device according to claim 7, wherein the amplifiers are connected at second output terminal to the second-type signal lines in increment fashion, such that the second output terminals of the amplifiers of any group consisting of as many amplifiers as the data items constituting the compressed data are connected to the second-type signal lines, respectively.

9. A semiconductor memory device according to claim 4, wherein the least one second-type signal line is used to multiplex the data items read from the cell array.

10. A semiconductor memory device according to claim 1, wherein the first-type signal lines and the at least one second-type signal line are pre-charged to the same potential before data items are read from the cell array.

11. A semiconductor memory device according to claim 1, wherein the amplifiers are designed to charge and discharge the first-type signal lines and the at least one second-type signal line.

12. A semiconductor memory device according to claim 11, wherein the amplifiers are provided in a number larger than a total number of the first-type signal lines and the at least one second-type signal line.

13. A semiconductor memory device according to claim 12, wherein the amplifiers are selectively activated.

14. A semiconductor memory device according to claim 1, wherein the at least one coincidence/non-coincidence determining circuit comprises an AND circuit and a NOR circuit; any first-type signal line to which the first output terminals of the amplifiers having second output terminals connected to the at least one second-type signal line are connected is connected to the AND circuit; and an output terminal of the AND circuit and at least one second-type signal line are connected to the NOR circuit.

15. A semiconductor memory device comprising:

a cell array comprising a plurality of word lines, a plurality of bit lines intersecting with the word lines, and memory cells arranged at intersections of the word lines and bit lines, forming a matrix;

a plurality of sense amplifiers for detecting data items stored in the memory cells;

a plurality of amplifiers connected to the sense amplifiers, each having first and second output terminals from which two outputs complementary to each other are output;

a plurality of first-type signal lines provided in a maximum number of data items that can be read from the cell array simultaneously, said amplifiers having the first output terminals connected to the first-type signal lines in increment fashion, such that the first output terminals of the amplifiers of any group consisting of as many amplifiers as the maximum number of data items are connected to the first-type signal lines, respectively;

at least one second-type signal line provided in a number of data items constituting compressed data, said amplifiers having the second output terminals connected to the second-type signal lines in increment fashion, such that the second output terminals of the amplifiers of any group consisting of as many amplifiers as the data items constituting the compressed data are connected to the second-type signal lines, respectively; and at least one coincidence/non-coincidence determining circuit connected to the first-group signal lines and the at least one second-group signal line, for determining whether each bit of the compressed data indicates that the corresponding bits stored in the memory cells one cell are identical in polarity.

16. A semiconductor memory device according to claim 15, wherein the first-type signal lines and the at least one second-type signal line are pre-charged to the same potential before data items are read from the cell array.

17. A semiconductor memory device according to claim 15, wherein the amplifiers are designed to charge and discharge the first-type signal lines and the at least one second-type signal line.

18. A semiconductor memory device according to claim 15, wherein the at least one coincidence/non-coincidence determining circuit comprises an AND circuit and a NOR circuit; any first-type signal line to which the first output terminals of the amplifiers having second output terminals connected to the at least one second-type signal line are connected is connected to the AND circuit; and an output terminal of the AND circuit and at least one second-type signal line are connected to the NOR circuit.

\* \* \* \* \*